United States Patent
Bay et al.

(10) Patent No.: US 7,417,394 B2
(45) Date of Patent: Aug. 26, 2008

(54) ARRANGEMENT FOR TESTING A POWER OUTPUT STAGE

(75) Inventors: Wolfgang Bay, Frankfurt (DE); Michael Henninger, Kelkheim (DE)

(73) Assignee: Siemens Aktiengesellschaft, München (DE)

( * ) Notice: Subject to any disclaimer, the term of this patent is extended or adjusted under 35 U.S.C. 154(b) by 249 days.

(21) Appl. No.: 10/583,497

(22) PCT Filed: Nov. 9, 2004

(86) PCT No.: PCT/EP2004/052882

§ 371 (c)(1),
(2), (4) Date: Jun. 16, 2006

(87) PCT Pub. No.: WO2005/060061

PCT Pub. Date: Jun. 30, 2005

(65) Prior Publication Data

US 2007/0159180 A1    Jul. 12, 2007

(30) Foreign Application Priority Data

Dec. 17, 2003   (DE) ............................... 103 59 236

(51) Int. Cl.
*H02P 6/12*   (2006.01)
(52) U.S. Cl. .................. 318/434; 318/811; 363/95; 330/2; 330/146
(58) Field of Classification Search ............... 318/138, 318/434, 801, 803, 432, 293, 439, 158, 159; 363/16, 37, 39, 41, 95, 98, 141; 330/2, 146, 330/251, 10
See application file for complete search history.

(56) References Cited

U.S. PATENT DOCUMENTS

| | | | |
|---|---|---|---|
| 5,363,039 A | 11/1994 | Kumar et al. | |
| 5,677,611 A * | 10/1997 | Yoshihara et al. | ............ 318/803 |
| 5,764,024 A * | 6/1998 | Wilson | ........................ 318/805 |
| 6,078,173 A | 6/2000 | Kumar et al. | |
| 6,153,993 A * | 11/2000 | Oomura et al. | ............... 318/434 |
| 6,330,140 B1 | 12/2001 | Wilson-Jones et al. | |
| 6,400,163 B1 | 6/2002 | Melcher et al. | |
| 6,400,181 B1 * | 6/2002 | Joch | ............................. 326/75 |
| 6,586,894 B2 * | 7/2003 | Engelaar et al. | .............. 315/370 |
| 2001/0020836 A1 | 9/2001 | Joch | |
| 2004/0257017 A1 | 12/2004 | Bay et al. | |

FOREIGN PATENT DOCUMENTS

DE   38 00 553   7/1998

(Continued)

*Primary Examiner*—Rajnikant B Patel
(74) *Attorney, Agent, or Firm*—Cohen Pontani Lieberman & Pavane LLP

(57) ABSTRACT

The invention concerns a device for controlling a final power-output stage, the latter comprising three half-bridges consisting respectively of a series circuit including an upper semiconductor switch and a lower semiconductor switch and subjected to a service voltage, the connection points of the semiconductor switches of the half-bridges forming outputs which are connected to the windings of a motor having at least three phases. The invention is characterized in that there is provided a control device for shifting on-state respectively one semiconductor switch or simultaneously several semiconductor switches according to a predetermined programme and for determining whether the respective voltages at the outputs are respectively within a predetermined tolerance range for the corresponding switching state.

7 Claims, 1 Drawing Sheet

FOREIGN PATENT DOCUMENTS

| | | |
|---|---|---|
| DE | 199 63 384 | 4/2001 |
| DE | 100 57 156 | 6/2001 |
| EP | 0 823 765 | 8/1996 |
| EP | 1 475 875 | 3/2004 |
| WO | WO 94/11747 | 5/1994 |
| WO | WO 97/32220 | 9/1997 |

* cited by examiner

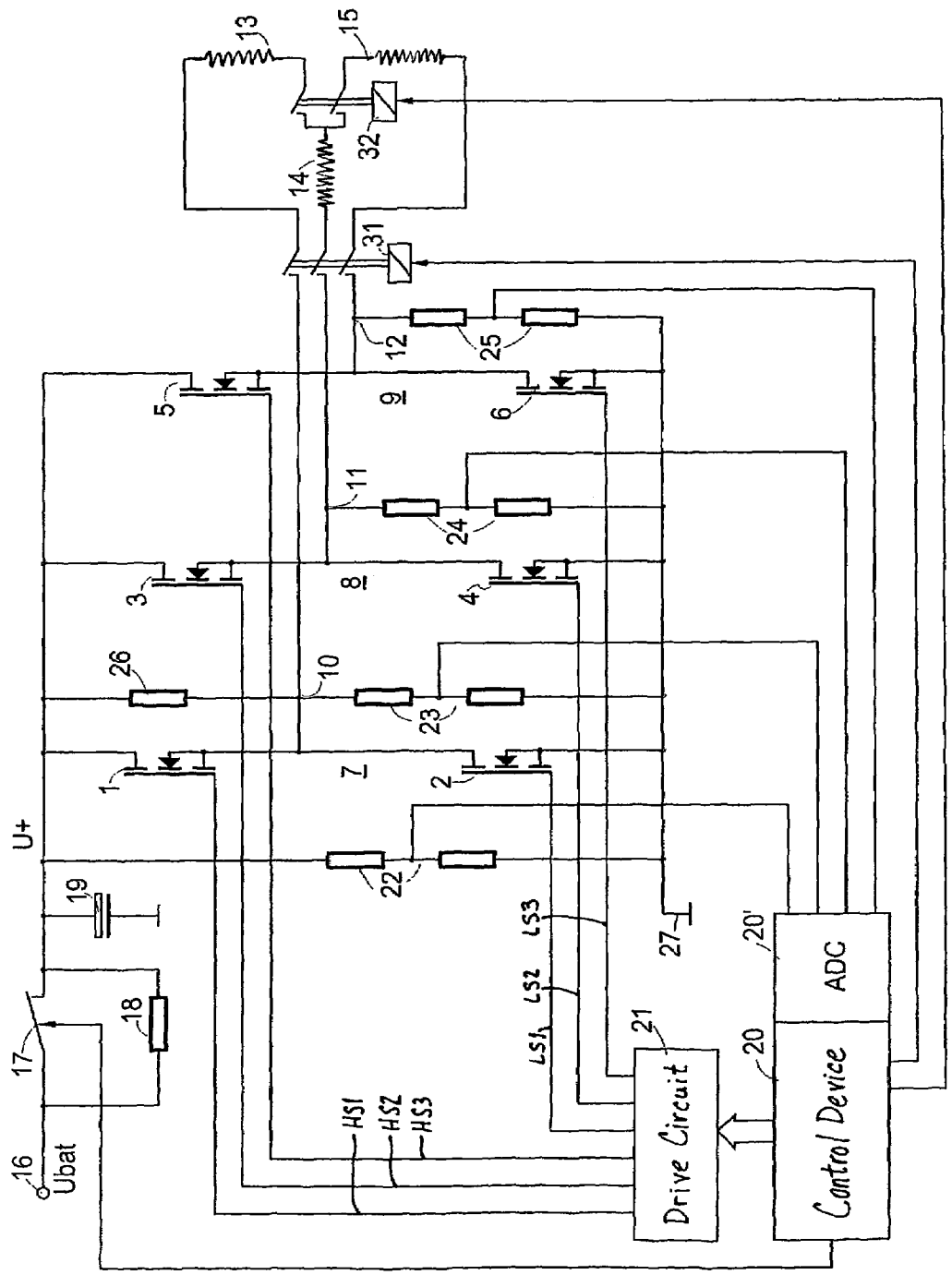

ARRANGEMENT FOR TESTING A POWER OUTPUT STAGE

PRIORITY CLAIM

This is a U.S. national stage of application No. PCT/EP2004/052882, filed on 9 Nov. 2004. Priority is claimed on the following application(s): Country: Germany, Application No.: 103 59 236.9, Filed: 17 Dec. 2003 the content of which is incorporated here by reference.

BACKGROUND OF THE INVENTION

1. Field of the Invention

The invention relates to an arrangement for testing a power output stage, the power output stage having at least three half-bridges which each comprise a series circuit formed by an upper and a lower semiconductor switch and to which the operating voltage is applied, and the junction points of the semiconductor switches of the half-bridges forming outputs which are connected to windings of an at least three-phase motor.

2. Description of Prior Art

Power output stages equipped with semiconductor switches are used inter alia in motor vehicles for driving loads, for example motors. By virtue of the rapid development of low-impedance power MOSFETs, even loads in the kilowatts range can be driven cost-effectively. In motor vehicles it can happen that the power output stage and the load are arranged spatially separate from one another, in which case short circuits of the load feed lines to ground or to battery voltage may lead to high fault currents. Fusible links generally cannot be used in these electric circuits on account of their tolerances, their internal resistances and the high useful currents. Moreover, a high fault current may flow on account of a defective MOSFET in the power output stage.

SUMMARY OF THE INVENTION

An object of the invention to provide a testing of the power output stages, so that in the ease of a short circuit, the operating voltage is switched off or not even switched on in the first place, and the power output stage and the on-board electrical system are thus protected against damage.

This object is achieved in the case of the arrangement according to the invention by a control device, which switches respectively one or respectively simultaneously a plurality of the semiconductor switches of a power output stage into the on state according to a predetermined program and in the process tests whether the respective voltages at the outputs respectively lie within a predetermined tolerance range for the respective switching state.

The state of the power output stage and of the connected lines and windings can be assessed in differentiated fashion by means of the method according to the invention, the motor not being influenced, or only being imperceptibly influenced, during the testing. The testing may be effected automatically before the power output stage is respectively switched on, for example when the ignition lock of a motor vehicle is actuated, or else may be carried out during operation.

The feeds to the windings can be interrupted with the aid of further switches. As a result of the isolation of the windings with the aid of the further switches, respectively one to all of the upper semiconductor switches or one to all of the lower semiconductor switches can be simultaneously controlled into the on state, so that a precise fault analysis is possible.

According to one embodiment of the invention, the windings of the motor form a star connection, and that the further switches are arranged at the star point and in the feed lines from the outputs to the windings. Although other controllable switches are also suitable for the arrangement according to the invention, the further switches are relays in the preferred embodiment. The invention can also be applied to delta-connected windings.

Since the operating voltage of the power output stages is generally significantly higher than that of microprocessors or digital signal processors, a further embodiment of the invention includes connections of the outputs of the half-bridges and of the operating voltage to inputs of window comparators via voltage dividers.

In order to ensure a reproducible voltage at the outputs when semiconductor switches are switched off, in the case of the method according to the invention means may be provided which have the effect that when semiconductor switches are not in the on state, the respective output voltage lies within the predetermined average tolerance range.

This development is preferably configured in such a way that the means are formed by a resistor, which is located between the output of one of the half-bridges and the operating voltage source and generates together with the voltage divider at the output a voltage in the average tolerance range.

Testing without an overloading of the power output stage and of the devices for voltage supply is possible by virtue of the fact that a controllable switch is provided in the feed line of the operating voltage, a resistor being connected in parallel with said controllable switch, and in that the controllable switch can be controlled by the control device. As an alternative, in the case of the arrangement according to the invention it may be provided that the pulses serving for testing are so short that no overloading of the semiconductor switches takes place and, moreover, the load is not influenced or is only imperceptibly influenced during the testing.

BRIEF DESCRIPTION OF THE DRAWINGS

The sole FIGURE is a schematic diagram of a power output stage connected to windings of a motor according to an embodiment of the present invention.

DETAILED DESCRIPTION OF THE PREFERRED EMBODIMENTS

In the case of the exemplary embodiment illustrated, two MOSFETs 1, 2; 3, 4; 5, 6 respectively form a half-bridge 7, 8, 9 having outputs 10, 11, 12, to which one of the star-connected windings 13, 14, 15 of a motor is respectively connected. Contacts of a relay 31 are located in the feed lines to the windings 13, 14, 15. In addition, the start point can be interrupted with the aid of a further relay 32.

The operating voltage Ubat is fed to an input 16, and is fed as U+ via a relay 17 to the power output stage. Connected in parallel with the relay 17 is a current limiting resistor 18, via which an electrolytic capacitor 19 having a high capacitance can be charged, the relay 17 only being switched on if the voltage U+ approximately corresponds to the voltage Ubat. An impermissibly high charging current surge is thus avoided. Details concerning this known circuit for avoiding a high charging current surge are explained in DE 100 57 156 A1.

The arrangement furthermore comprises a control device 20, which is known as such in connection with power output stages, formed by a microcomputer or a digital signal processor and as such need not be explained in any greater detail for an understanding of the invention. Outputs of the control device 20 are connected to a drive circuit 21, which generates control signals HS1, HS2, HS3, LS1, LS2, LS3 for the MOSFETs 1 to 6. Analog/digital converters 20' connected to window comparators are furthermore connected to the control device 20, and voltages generated by a respective voltage divider 22, 23, 24, 25 can be fed to the inputs of the converters 20'. The voltage dividers 22-25 have significantly higher resistance values than the windings 13, 14, 15 in order not to impair the efficiency of the output stage during operation. In addition, coils of the relays 31, 32 are connected to outputs of the control device 20.

A resistor 26 is connected in parallel with the MOSFET 1, which resistor, together with the voltage divider 23, has the effect that half of the voltage U+ is present at the output 10 of the half-bridge 7 in the case of MOSFETs 1, 2 that are not in the on state.

The voltage dividers 22 to 25 are designed in such a way that at the highest possible value of U+, the permissible voltage of CMOS circuits is not exceeded. The voltage generated by the voltage divider 22 serves for the individual tests described below as a voltage reference for forming the tolerance ranges.

During the first test, with contacts of the relay 31 initially open, the MOSFETs 1 to 6 are not driven, so that the output 10 carries the voltage U+/2, which is checked in the control device 20 whilst taking account of a predetermined tolerance. If the output 10 has a voltage within the predetermined tolerance, it can be deduced from this that no short circuit to ground 27 or operating voltage U+ is present in the MOSFETs 1, 2 and in the feed line up to the relay 31. The MOSFETs 3 to 6 are also not in the on state during this first test, so that when the contacts of the relay 31 are subsequently closed outputs 11, 12 are connected to the output 10 via windings 13-15 of the motor. If the power output stage is free of faults, the voltage at the outputs 11, 12 should likewise lie within an average tolerance range, which is tested by the control device 20.

During another test, the "upper" MOSFETs 1, 3, 5 are successively switched into the on state and in the process a check is respectively made to determine whether the outputs 10, 11, 12 assume a voltage lying within an upper tolerance range, that is to say in the vicinity of the voltage U+. During a further test, the "lower" MOSFETs 2, 4, 6 are successively brought to the on state. In this case, a check is respectively made to determine whether the voltage at the outputs 10, 11, 12 lies within the lower tolerance range, that is to say—compared with U+—in the vicinity of the ground potential. These tests may be performed successively with closed and opened contacts of the relays 31, 32.

By virtue of the arrangement of the relays, it is possible, for test purposes, to switch respectively one, two or all of the upper and lower semiconductor switches into the on state and to observe the behavior of the voltages at the outputs. The type and the location of the defect, for example short circuit, overloading or relay defects, can be deduced from the magnitude by which the respective tolerance range is exceeded or undershot.

What is claimed is:

1. An arrangement in a power output stage for testing the power output stage, said power output stage having at least three half-bridges, each of said half-bridges comprising a series circuit including an upper semiconductor switch and a lower semiconductor switch connected at a junction point forming an output, said power output stage further comprising means for applying an operating voltage to each of said at least three half-bridges and windings of an at least three phase motor connected to respective outputs of said at least three half-bridges, said arrangement comprising a control device connected to each of said upper and lower semiconductor switches and running a program, said control device arranged and dimensioned for switching one or a plurality of said upper and lower semiconductor switches to an on state according to a switching state defined by the program, said control device further connected to said outputs and arranged and dimensioned for testing whether the voltages at the respective outputs lie within predetermined tolerance ranges for the switching state, said arrangement further comprising further switches for interrupting feeds to said windings.

2. The arrangement of claim 1, wherein said windings are connected by a star connection, said further switches are arranged at said star connection and at feed lines between said outputs and said windings.

3. The arrangement of claim 1, wherein said further switches comprise relays.

4. The arrangement of claim 1, further comprising voltage dividers connected to each of said outputs and said means for applying the operating voltage, wherein said control device comprises window comparators connected, via said voltage dividers, to each of said outputs and to said means for applying the operating voltage.

5. The arrangement of claim 1, further comprising a device arranged and dimensioned for causing said output voltages to lie within respective predetermined average tolerance ranges when each of said upper and lower semiconductor switches is not in the on state and when the operating voltage is applied.

6. The arrangement of claim 4, further comprising a device arranged and dimensioned for causing said output voltages to lie within respective predetermined average tolerance ranges when each of said upper and lower semiconductor switches is not in the on state, said device comprising a resistor connected between said output of one of the half bridges and said means for applying an operating voltage, said resistor being arranged and dimensioned for generating, together with said voltage divider corresponding to said output of said one of said half bridges, a voltage in the average tolerance range.

7. The arrangement of claim 1, further comprising a controllable switch arranged between said means for applying said operating voltage and a terminal for receiving the operating voltage, and a resistor connected in parallel with said controllable switch, wherein said controllable switch is connected to said control device.

* * * * *